(12) United States Patent
Higashi

(10) Patent No.: US 6,887,628 B2
(45) Date of Patent: May 3, 2005

(54) MANUFACTURING METHOD FOR PHOTOMASK

(75) Inventor: Fumiaki Higashi, Kumamoto (JP)

(73) Assignee: Hoya Corporation, Tokyo (JP)

( * ) Notice: Subject to any disclaimer, the term of this patent is extended or adjusted under 35 U.S.C. 154(b) by 99 days.

(21) Appl. No.: 10/166,047

(22) Filed: Jun. 11, 2002

(65) Prior Publication Data

US 2003/0096175 A1 May 22, 2003

(30) Foreign Application Priority Data

Nov. 22, 2001 (JP) .................................. P. 2001-358263

(51) Int. Cl.$^7$ .............................. G03F 9/00; G03C 5/00
(52) U.S. Cl. .......................... 430/5; 430/296; 430/363; 430/945
(58) Field of Search ........................... 430/5, 363, 945, 430/296

(56) References Cited

U.S. PATENT DOCUMENTS 5,725,974 A * 3/1998 Kawahira ...................... 430/5
5,766,802 A * 6/1998 Skinner ......................... 430/5

FOREIGN PATENT DOCUMENTS

JP 2001-250197 9/2000

OTHER PUBLICATIONS

Technical Report of FPD Intelligence 1999.5.

* cited by examiner

Primary Examiner—Geraldine Letscher
(74) Attorney, Agent, or Firm—Sughrue Mion, PLLC

(57) ABSTRACT

A manufacturing method for a photomask includes a step of performing a writing operation at a predetermined scanning unit in a direction in which a head of a writing system is to be scanned (Y direction) and at a predetermined overrun unit in a direction perpendicular to the scanning direction (X direction). A pattern of the photomask includes a cyclic pattern. The writing step includes a step of writing pattern units (e.g., pixel units 20) under identical overrun conditions (e.g., a grid head 17a is aligned with the left end of each pixel unit 20 such that writing is commenced from the left end of each pixel unit 20), the pattern units including identical cyclic patterns.

17 Claims, 9 Drawing Sheets

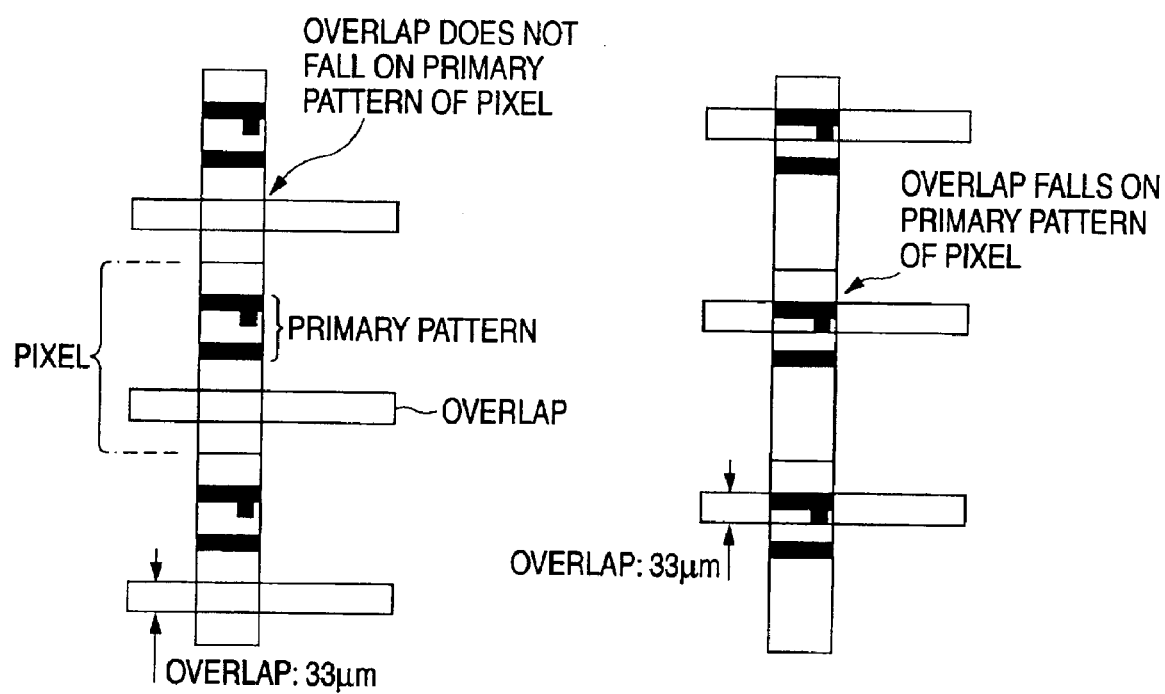

MANUFACTURING METHOD FOR PHOTOMASK

BACKGROUND OF THE INVENTION

1. Field of the Invention

The invention relates to a manufacturing method for a photomask including a step of writing a cyclic pattern, and to a photomask. Particularly, the invention relates to a manufacturing method for a graytone mask involving a precise cyclic pattern, and to a graytone mask.

2. Description of the Related Art

In recent years, attempts have been made to cut down the number of mask sheets by using graytone masks in the field of large-sized LCD masks (as set forth in the monthly FPD Intelligence, May, 1999).

As shown in FIG. 10A, such a graytone mask has an opaque part 1, a transmission part 2 and a graytone part 3. The graytone part 3 corresponds to an area in which there is formed a opaque pattern 3a of below or equal to the resolution limit of an exposure apparatus for a large-sized LCD using the graytone mask and is designed to selectively change the thickness of a photoresist film by decreasing the light transmitted through this area so as to decrease the amount of irradiation due to the area. Normally, the opaque part 1 and the opaque pattern 3a are formed with films that are made of the same material such as chromium (Cr) or a chromium compound and have the same thickness.

The resolution limit of the exposure apparatus for the large-sized LCD using the graytone mask is about 3 $\mu$m in the case of an exposure apparatus of a stepper type and about 4 $\mu$m in the case of an exposure apparatus of a mirror projection type. Consequently, the space width of a transmission part 3b in the graytone part of FIG. 10A is set at less than 3 $\mu$m and the line width of the opaque pattern 3a of below or equal to the resolution limit of the exposure apparatus is set at less than 3 $\mu$m, for example. When the exposure apparatus for the large-sized LCD is used for light exposure, as the exposure light transmitted through the graytone part 3 as a whole is deficient in the amount of light exposure, positive photoresists are left on a substrate though the thickness of the positive photoresists exposed to light via the graytone part 3 solely decreases. More specifically, there arises a difference in solubility of resists in developing liquid between parts corresponding to the ordinary opaque part 1 and to the graytone part because of difference in the amount of light exposure and this results in, as shown in FIG. 10B, making a part 1' corresponding to the ordinary opaque part 1 as thick as about 1.3 $\mu$m, making a part 3' corresponding to the graytone part 3 as thick as about 0.3 $\mu$m and making a part corresponding to the transmission part 2 a part 2' without resists, for example. A first etching of a substrate as a workpiece is carried out in the part 2' without the resists so as to remove the resists in the thin part 3' corresponding to the graytone part 3 by ashing and the like and by carrying out a second etching of this part, the etching process is performed with one mask instead of two masks as conventionally used in order to reduce the number of masks for use.

In a writing process to be performed by a laser beam writing system during the course of manufacture of a foregoing graytone mask, a pattern area of, e.g., systematically arranged pixels, and another pattern area of irregular configuration are written uniformly without involvement of a distinction therebetween. Specifically, as shown in FIG. 13, in relation to a cyclic pattern area 10 such as a pixel array, a writing system successively writes a pattern in writing units 12 inherent to the writing system without regard to a cyclic unit 11 of the pattern. In other words, an entire pattern belonging to the writing unit 12 inherent to the writing system is written as a single pattern. As shown in FIG. 14, a slight difference regularly arises in the width of a written line and the coordinates of the line, in accordance with the position of a laser beam with respect a direction in which the laser beam is to be scanned (i.e., a direction the beam sweeping width). In other words, variations regularly arise in the accuracy of writing unique to the writing system in the direction in which a laser beam is to be scanned. As shown in FIG. 15, pattern cyclic units 11 which are to be adjoined to each other in the scanning direction are written with different beam positions "a" and "b" provided along a beam sweeping width 13 (i.e., a scanning length or a range in which a pattern is written by means of a single scan of a beam). As a result, a line width difference arises in different positions of each pattern cyclic unit 11. In this way, there is written a pattern of deteriorated uniformity; for example, a pattern whose geometry is deteriorated. Consequently, there arises a problem of cyclic inconsistencies (e.g., visible streaks) appearing in a cyclic pattern area stemming from a slight difference in line width of a pattern or accuracy of coordinate position. Otherwise, there arises a problem of a mask which is deteriorated in terms of uniformity of the geometry of a cyclic pattern. Particularly, a fine pattern constituting a graytone section is usually a cyclic pattern, which will raise a problem of unevenness.

When attention is paid to a channel provided in each pixel of a mask for use in manufacturing, e.g., a thin-film transistor (TFT) liquid-crystal display device (LCD), as shown in FIG. 16 the beam scanning width 13 does not match the length of pixels 14 in the direction Y. The position of the beam used for writing each pixel changes from one pixel to another. Thus, pixels are not written under identical conditions, and unevenness repeatedly arises in the dimensional accuracy of a channel portion 15. For instance, if a center position 13b in a beam scanning width 13 has superior writing accuracy (i.e., dimensional accuracy) and adjacent positions 13a, 13c have deteriorated writing accuracy, a channel 15 located in the pixel 14a has superior dimensional accuracy, and a channel 15 provided in the pixel 14b has deteriorated dimensional accuracy.

In order to solve a problem which is analogous to that mentioned above and arises in a photomask used for manufacturing a liquid-crystal display, Japanese Patent Application Laid-Open No. 250197/2000 describes a technique for preventing cyclic irregularities in a pattern. According to the technique, a ratio of pattern pitch to the pitch of a writing seam is set so as to become an integral multiple such that the least common multiple between the pattern pitch and the pitch of a writing seam assumes a value of 1 mm or less.

Such a problem also applies to a graytone section consisting of a fine cyclic pattern of graytone mask. For instance, in relation to a graytone section consisting of lines and spaces, when lines are separated on a per-writing basis inherent to a writing system, a problem analogous to that mentioned above arises.

The method described in the foregoing patent application is for preventing occurrence of cyclic inconsistencies in a pattern, which would otherwise arise in a scanning direction (i.e., the Y direction). For example, in the case of a laser writing system, a beam is emitted in a direction perpendicular to a scanning direction (i.e., the X direction) as well as in the scanning direction, at a pitch of beam size (or a grid) of the laser beam unique to the system (i.e., a beam spot). At this time, a line width of a writing pattern is controlled by means of adjusting beam power.

As shown in FIG. 17, in relation to a grid corresponding to a overrun width of a laser beam (beam spot) in the X direction unique to the system, the length of a pixel in the X direction (design data) 16 is not designed in consideration of an integral number of grids 17 being housed in the pixel. Hence, a grid head 17a may become misaligned in each pixel. As shown in FIG. 18, as a result of the grid head becoming misaligned at the left end of each pixel, the positions of the grids 17 used for writing channel sections 15 in the respective pixels 14 also become misaligned.

In the laser writing system, the channels 15 of respective pixels theoretically have an identical line width even if the grids 17 have become misaligned. However, in reality, the channels 15 of the respective pixels have turned out to differ in line width from each other. Accordingly, there is a problem of use of the technique described in the publication being insufficient for drawing, e.g., a fine precision pattern of a graytone mask, with superior accuracy.

In the related-art technique, a pitch of writing seam is determined by means of controlling the head scanning width of a mask writing system and a overrun pitch of a stage. However, matching the scanning width (a beam sweeping width) with a pitch of writing seam involves a change in system configuration. Moreover, a writing seam varies from one photomask to another. Hence, in practice there arises a problem of the inability to change a scanning width.

When a photomask pattern is constituted of a cyclic pattern section consisting of a cyclic pattern and a normal pattern section consisting of another pattern, a data area pertaining to an overall mask is taken as a single set of writing data. Accordingly, the volume of data becomes enormous. Particularly, since a cyclic pattern constituting a graytone section is fine, in some cases the volume of data will become massive at the time of preparation of data. The volume of data exceeds the capacity of a writing system or that of a data converter provided along with the writing system.

SUMMARY OF THE INVENTION

A first object of the invention is to provide a manufacturing method (writing method) for a photomask which has a high degree of geometrical uniformity in a cyclic pattern area and involves fewer variations.

A second object of the invention is to provide a manufacturing method (writing method) for a photomask, such as a graytone mask, which enables manufacture of a liquid-crystal display device having a high degree of geometrical and dimensional uniformity in pixels and involving fewer variations.

A third object of the invention is to provide a manufacturing method (writing method) for a photomask, such as a graytone mask, which enables a reduction in the volume of writing data.

The invention has the following configurations:

A manufacturing method for a photomask including a step of performing a writing operation at a predetermined scanning unit in a direction in which a head of a writing system is to be scanned (Y direction) and at predetermined overrun units in a direction perpendicular to the scanning direction (X direction), wherein
  a pattern of the photomask includes a cyclic pattern; and
  the writing step includes a step of writing pattern units including a uniform cyclic pattern under identical overrun conditions.

The manufacturing method, the beginning of a overrun unit is set to a start point of writing of a pattern unit, so that the pattern units are written under the same overrun conditions.

In the manufacturing method writing data pertaining to a overrun unit are set by means of scaling down or up pattern data such that the pattern unit becomes substantially an integral multiple of a overrun unit, and the pattern data are written after having been scaled up or down to the original size, whereby the pattern units are written under the same overrun conditions.

The writing step includes a step of writing the pattern units under the same scanning conditions.

The width of a scanning unit is matched with the width of a pattern unit by use of a predetermined range, which is smaller than the scanning unit of the head of the writing system, thereby writing a pattern in the pattern units under uniform scanning conditions.

A manufacturing method for a photomask including a writing step of writing a pattern including a cyclic pattern at a predetermined scanning unit in a direction in which a head of a writing system is to be scanned (Y direction) and at a predetermined scanning unit in a direction perpendicular to the scanning direction (X direction), wherein
  a pattern of the photomask includes a cyclic pattern; and,
  in the writing step, a pattern is written on the pattern units including a uniform cyclic pattern under uniform scanning conditions, by use of a predetermined range smaller than the scanning unit for the head of the writing system, to thereby match the width of a scanning unit with the width of a pattern unit.

A manufacturing method for a photomask includes a step of performing a writing operation at a predetermined scanning unit in a direction in which a head of a writing system is to be scanned (Y direction) and at a predetermined overrun unit in a direction perpendicular to the scanning direction (X direction), wherein
  a photomask of the pattern includes a cyclic pattern section formed from a cyclic pattern and a normal pattern section formed from another pattern; and, in the writing step, the cyclic pattern section and the normal pattern section are written in different writing steps, and the cyclic pattern is written such that pattern units including a uniform cyclic pattern satisfy identical overrun conditions and/or identical scanning conditions.

The photomask is for producing a liquid-crystal display device; and the pattern unit includes an integral number of pixel patterns to be used for preparing pixels of the liquid-crystal device.

The photomask is a graytone mask including a opaque section having a opaque film formed thereon, a transmission section, and a graytone section in which is arranged a opaque film pattern having a pattern size smaller than a resolution limit of an exposure system using a mask and which permits partial transmission of exposing radiation; and the graytone section includes a cyclic pattern.

A photomask may be manufactured through use of the manufacturing methods defined above.

A pattern transfer method may be provided for transferring a pattern through use of the photomask.

According to the invention, a manufacturing method for a photomask includes a step of writing a pattern including a cyclic pattern at a predetermined scanning unit in a direction in which a head of a writing system is to be scanned (Y direction) and at predetermined overrun units in a direction perpendicular to the scanning direction (X direction), wherein the writing step includes a step of writing pattern units, including a uniform cyclic pattern, under identical overrun conditions. A pattern is written at the same location on each pattern unit by means of a laser beam of fixed power, thereby preventing variations in pattern, which would otherwise periodically arise in the X direction. Thus, there can be prevented occurrence of variations in line width at the same location on a pattern unit.

The pattern unit includes a cyclic unit formed by combination of a plurality of minimum cyclic units, as well as a minimum cyclic unit. A cyclic unit of a pattern (a cyclic pattern unit) is not limited to a pixel to be described later and may also encompass a cyclic pattern unit in a pixel, a cyclic pattern unit in a peripheral area, and a cyclic pattern unit in a graytone section of a graytone mask.

The identical overrun conditions are conditions under which overrun operation is effected such that a uniform layout of beam size (i.e., a grid size) is achieved in the pattern areas.

According to the invention, the beginning of a overrun unit is set to a start point of writing of a pattern unit so that the patterns can be written under the same overrun conditions without fail.

FIG. 1 depicts an example in which a overrun unit is set to a start point of writing operation; a grid head 17a is aligned with the left end of each predetermined writing unit 20 such that writing is to be started from the left end of each predetermined writing unit 20. As a result, the pattern 18 in the predetermined writing units 20 is written under fixed grid conditions. In this case, a portion of a pattern which has been written so as to extend off the writing unit is again written at the time of the next writing operation. Since the portion of that pattern that extends off a writing unit is written in all the writing units twice under the same conditions, dimensional variations do not arise among writing units. Since the head of a grid can be set by means of positioning a laser head and/or stage, the method can be used for repeatedly writing pattern units through use of pattern data.

According to the invention, writing data pertaining to a overrun unit are set by means of scaling down or scaling up pattern data such that the pattern unit becomes substantially an integral multiple of a overrun unit, and the pattern data are written after having been scaled up or down to the original size, whereby the pattern units are written under the same overrun conditions. More specifically, in order to enable writing of the pattern units under the same overrun conditions, a pattern unit becoming an integral multiple of a beam size is most preferable. However, an ordinary writing system cannot change a beam size, and hence a pattern unit coincides with an integral multiple of a beam size only in very rare cases. As shown in FIG. 2, the edge of a pattern unit is usually not aligned with a grid line (i.e., the edge of the pattern unit usually becomes offset from the grid line). As shown in FIG. 2, if the width of original data pertaining to a pattern in the X direction is reduced so as to be evenly divided by a beam size, the edge of the pattern unit is aligned with the grid line, and hence the pattern unit can be converted into data which match the beam size. As shown in FIG. 2, the writing data are written, and concurrently the data are subjected to enlarged writing through compensation such that the data are scaled up to the original size. As a result, the pattern units can be written properly under the same overrun conditions. In the above example, the data after having been scaled down are subjected to enlarged writing. In contrast, the data after having been enlarged may be subjected to reduced writing. In such a case, a pattern unit is set to a start point of writing thereof; namely, a pattern unit may be matched with a overrun unit. Alternatively, a pattern may be positioned while a pattern unit is offset from a overrun unit so that a superior pattern can be written in a pattern section which requires a high degree of accuracy.

The method is particularly effective for a case where there is employed a laser writing system which, in contrast with an electron beam writing system, cannot change a beam size.

According to another aspect of the invention, the pattern units are written under the same scanning conditions in the Y direction, whereby there can be prevented periodic variations, which would otherwise arise in both X and Y directions. Variations in line width at identical locations in a pattern unit can be reduced to a great extent.

FIG. 3 shows an example in which writing is performed while a cyclic pattern unit 11 is taken as one predetermined writing unit 20. In this case, the lower left corner in each predetermined writing unit 20 shown in FIG. 3 is taken as a start point of writing in all cases. In a case where such a writing operation is performed, even when, as shown in FIG. 4, a difference in writing accuracy unique to the writing system arises along a direction in which a laser beam is to be scanned (i.e., the Y direction), the difference can be caused to appear in the same location "c" on each predetermined writing unit 20. A pattern having a high degree of geometrical uniformity can be written on the writing units 20. Here, if variations are present in the same locations "c" on the respective predetermined writing units 20, the variations are generally less likely to be viewed as variations. Therefore, a variation-free mask can be produced.

A method of writing a pattern under fixed scanning conditions requires a match between a pattern unit and a scanning unit. The following methods, among others, are conceivable as such a method:, a method of changing a scanning unit of a head; specifically, a method of changing a scanning width of a laser in the case of a laser writing system; and a method of using a predetermined range which is smaller than a scanning unit of the head; specifically, a method of using a predetermined range without changing a scanning width of a laser in the case of a laser writing system. Needless to say, a stage overrun pitch is also changed at this time.

According to another aspect of the invention, there is used a predetermined range which is smaller than the scanning unit of the head of the writing system, thereby matching the width of a scanning unit with the width of a pattern unit. More specifically, as shown in FIG. 5A, writing operation is performed by means of matching a beam scanning width 13' to be used for writing with a predetermined length from the start point of a scanning operation; that is, a length in the Y direction in the predetermined writing unit 20 corresponding to a cyclic pattern unit, rather than a beam scanning width 13 unique to the system. In this case, writing precision tends to deteriorate with increasing scanning length. Hence, writing precision is improved, by use of a range of predetermined length from the start point of scan and cutting the remaining range. More specifically, as shown in FIG. 5B, writing data 30 are set to a scanning start point of a beam scanning width 13 unique to the writing system. The writing data are written in only an area assigned to the writing data 30. In an area 31 allocated no writing data, a beam is cut by means of a shutter or the like, thus preventing a laser beam from falling on the substrate. In this case, in place of pitch overrun data unique to the system which pitch-overruns a stage with a beam scanning width 13, there are required data used for pitch-overrun the stage in the Y direction, with the length of the writing data 30 in the Y direction. Conceivable methods for writing data through use of a predetermined range smaller than a beam scanning width include a method of setting the width of writing data to be used repeatedly to the width of data in a range smaller than a scanning width of a beam, and a method of changing a parameter of a writing system such that a beam scanning pitch matches a pattern unit.

As shown in FIG. 5C, writing operation is performed through use of a center portion 13" of the beam scanning width 13 unique to the system. Since the center portion of the beam scanning width 13 is more uniform in writing precision than surrounding portions, writing operation of higher uniformity can be effected. In this case, the writing data 30 are arranged in the center portion of the beam scanning width 13 unique to the system in an offset manner (i.e., the start point of writing is changed), and a beam is cut by means of a shutter or the like within an area assigned no writing data. By means of such a configuration, the width of a pattern unit can be matched with the width of a scanning unit without modification of the system, through use of only a portion of a beam scan while the laser scanning width is unchanged rather than by changing the laser scanning width so as to match the pattern unit with the scanning unit. In this case, the pattern unit may be matched with the overrun unit. Alternatively, a pattern may be positioned while the pattern unit is offset from the overrun unit so that a superior pattern can be written in a pattern section which requires a high degree of precision.

According to another aspect of the invention, writing is performed while the width of a scanning unit is matched with the width of the pattern unit in the Y direction, whereby a pattern is written under uniform conditions. In this case, a predetermined range for writing is used, wherein the range is smaller than the head scanning unit unique to the writing system, thereby matching the width of the scanning unit with the width of the pattern unit. Thus, a mask involving fewer variations can be prepared without modification of the system.

According to another aspect of the invention, a photomask of the pattern—including a cyclic pattern section formed from a cyclic pattern and a normal pattern section formed from another pattern—is written such that the cyclic pattern section is written in one writing step and the normal pattern section is written in another writing step. The cyclic pattern section is written such that pattern units including a uniform cyclic pattern satisfy identical overrun conditions and/or identical scanning conditions. Single cyclic pattern data are repeatedly used and written in a cyclic pattern section. As a result, the volume of writing data can be reduced, and load pertaining to the data capacity of the writing system and to that of a data converter provided along therewith can be reduced. Moreover, there can be prevented variations which would otherwise cyclically arise in the X direction and/or the Y direction. Hence, variations in line width at the same location in a pattern unit can be reduced. Specifically, the majority of a photomask used for a liquid-crystal display panel is occupied by a cyclic pattern section, such as pixels. Such a portion must satisfy severe quality specifications. In contrast, the remaining portions of the photomask must satisfy comparatively loose specifications. Hence, writing is performed separately in a portion requiring high quality and another portion requiring comparatively lower quality. As a result, patterns satisfying respective specifications can be produced efficiently. In this case, if cyclic pattern sections are of a plurality of types, only a cyclic pattern requiring a particularly precise pattern may be written on pattern units including a uniform cyclic pattern such that the pattern is produced fixed overrun conditions and/or fixed scanning conditions.

According to another aspect of the invention, there can be produced a graytone mask or photomask which achieves a high degree of geometrical uniformity in a cyclic pattern region and involves few variations. There can also be produced a graytone mask or photomask which achieves a high degree of geometrical and dimensional uniformity and has fewer variations in each pixel. Moreover, there can be readily manufactured a graytone mask or photomask which enables a reduction in the volume of writing data. A pixel included in a pattern unit is most preferably a single pixel. However, an integral number of pixels (preferably 10 pixels or less) may be included in a pattern unit for reasons of the volume of data or limitations on cyclic writing.

According to another aspect of the invention, visible variations do not raise any significant problem in a photomask or a normal graytone mask for semiconductor unless they affect the operation of a semiconductor element. However, in the case of a graytone mask for an LCD, the mask is of large size, and variations in a display area on the mask are particularly avoided. Therefore, the writing and manufacturing method of the invention for a graytone mask is particularly important for putting into practice a large graytone mask for an LCD (e.g., a mask to be used for producing a color filter or a TFT) or a large graytone mask for a PDP (plasma display panel).

When writing operation is performed through repeated use of one set of pixel data pattern data, the volume of writing data can be diminished. Hence, the method is particularly effective for producing a mask involving a large volume of data, such as a graytone mask for an LCD.

Also, there can be produced a photomask with a pattern having a high degree of geometrical and dimensional uniformity and few variations.

Also, there can be transferred a pattern having a high degree of geometrical and dimensional uniformity and few variations.

BRIEF DESCRIPTION OF THE DRAWINGS

FIGS. 7A and 7B are fragmentary plan views for describing a specific method of writing a pattern in the Y direction according to the second example of the invention;

FIGS. 10A and 10B are views for describing a graytone mask, wherein FIG. 10A is a fragmentary plan view, and FIG. 10B is a fragmentary cross-sectional view;

DESCRIPTION OF THE PREFERRED EXAMPLES

Examples of the invention will be described hereinbelow.

First Example

In a first example, a laser beam writing system having a wavelength of 413 nm (LRS-800 manufactured by MICRONIC Ltd.) was used for writing a graytone mask for use as a TFT LCD.

First, a photomask blank was prepared by means of sequentially forming a opaque film and a positive photoresist on a transparent substrate.

The entire mask is divided into a 10.4-inch pixel pattern area which is made of a cyclic pixel pattern and comprises 602 pixels in the Y direction and 2400 pixels in the X direction, and a normal pattern area around the 10.4-inch pixel pattern area.

Figure 1:
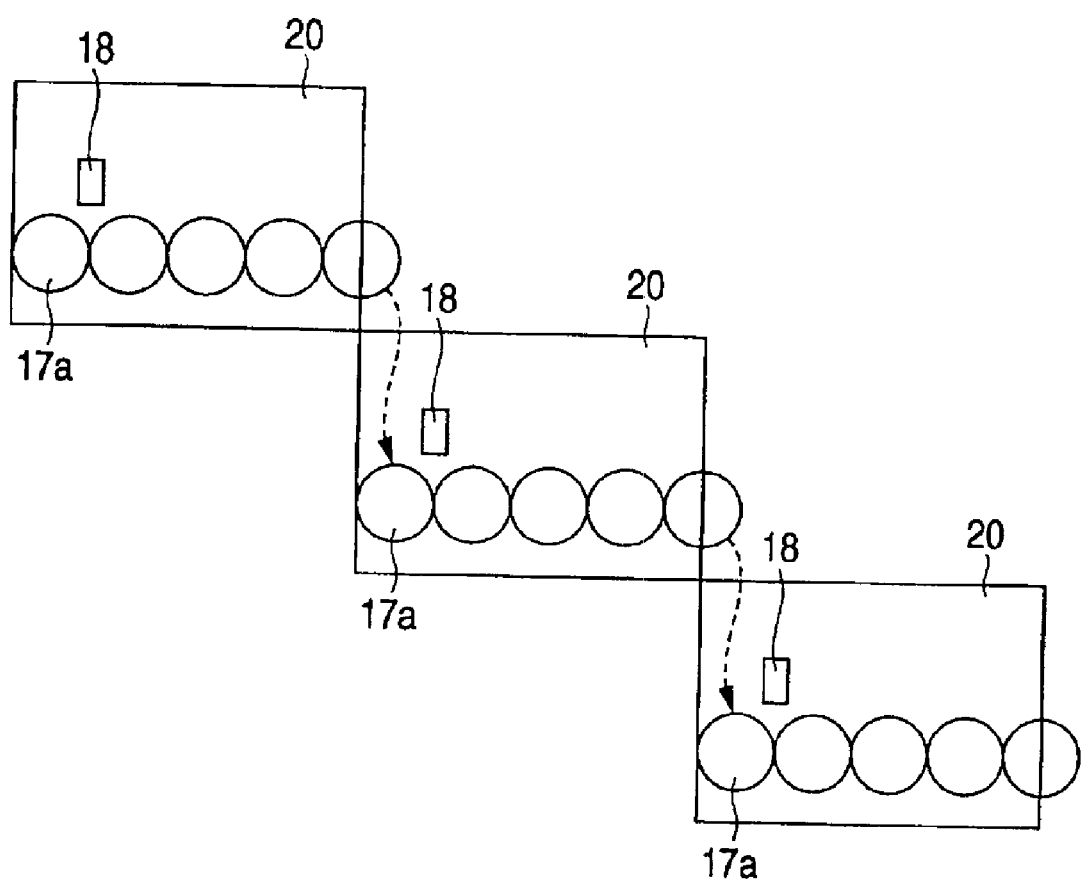
FIG. 1 is a fragmentary plan view for describing an example of a specific method of writing a pattern in the X direction according to the invention.
Figure 2:
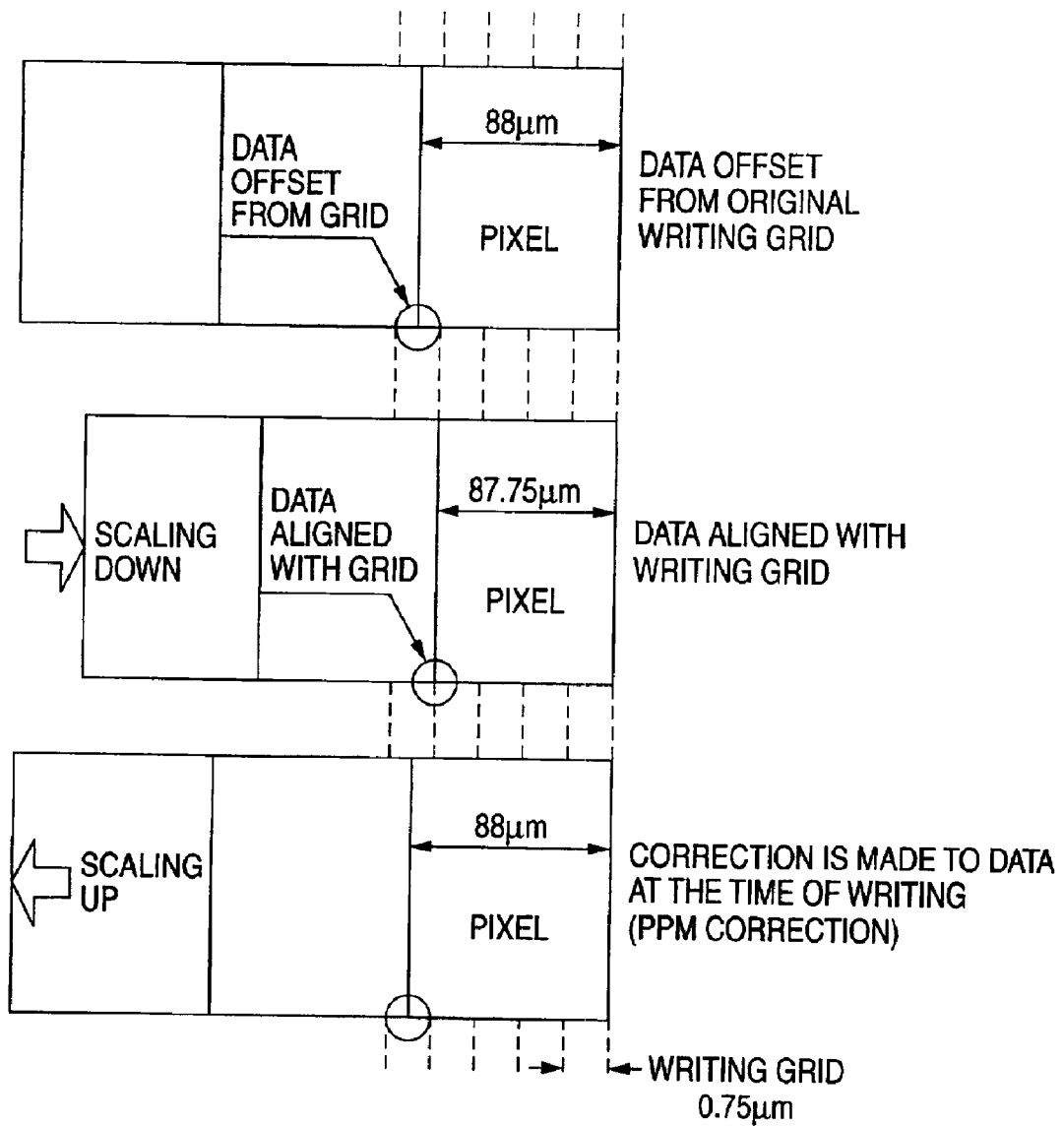
FIG. 2 is a fragmentary plan view for describing another example of the specific method of writing a pattern in the X direction according to the invention.
Figure 3:
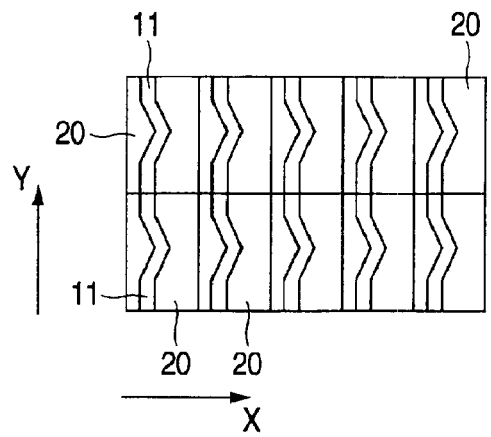
FIG. 3 is a fragmentary plan view for describing an example of a specific method of writing a pattern in the Y direction according to the invention.
Figure 4:
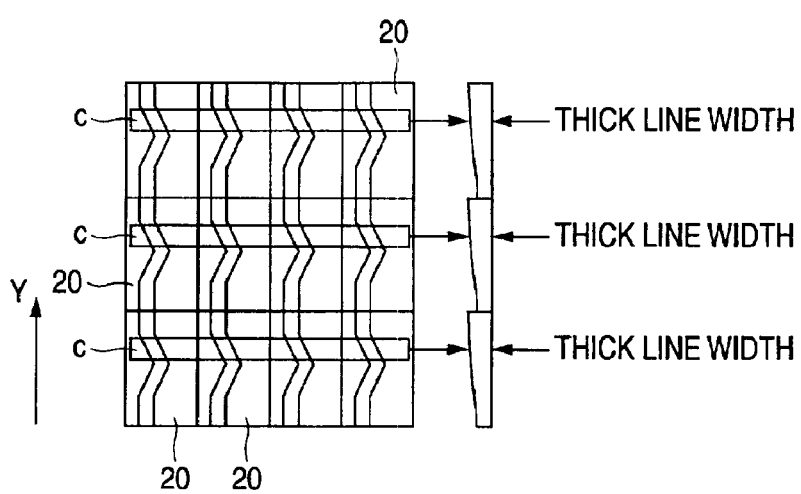
FIG. 4 is a fragmentary plan view for describing the effectiveness of a case where the writing mode shown in FIG. 3 is practiced.
Figure 5A:
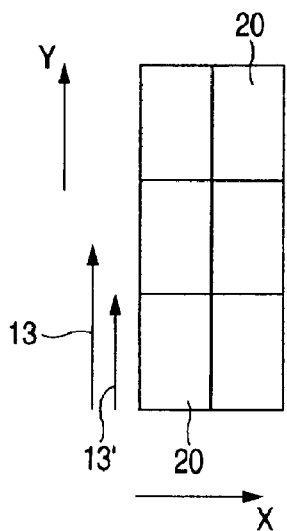
FIGS. 5A, 5B and 5C are fragmentary plan views for describing another example of the specific method of writing a pattern in the Y direction according to the invention.
Figure 5B:
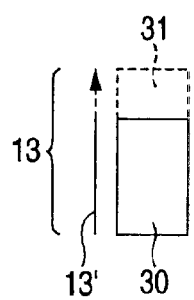
Figure 5C:
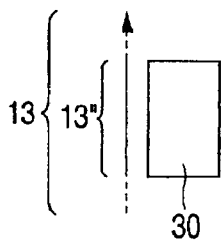

In the pixel pattern area, pixel data pertaining to one pixel were set as cyclic writing data. When the data are repeatedly written, as shown in FIG. 5A the writing data are set so as to become shorter than the scanning width of a beam with respect to the Y direction. When data corresponding to one pixel have been written, no subsequent writing data are written. At that time, a stage overrun pitch was set so as to match the data, and hence scanning was effected in the Y direction at one pixel pitch. As shown in FIG. 1, overrun action in the X direction was set such that grid head 17$a$ is aligned with the left end of each pixel.

Cyclic data were repeatedly written on a resist film of a photomask blank with resist, by means of repeatedly effecting overrun action in the X direction subsequent to scanning action in the Y direction, and matching one pixel with one writing unit.

Next, a pattern was written on a normal area at a writing unit unique to the system.

Subsequently, a photoresist was selectively removed with an alkaline development solution. A opaque film was selectively removed from the area from which the photoresist had been removed selectively, through etching or the like, thereby producing a graytone mask for use as a TFT LCD.

Comparative Example

The graytone mask for use as a TFT LCD was produced in the same manner as in the first example, except that a pattern was written on a writing unit unique to the writing system without dividing the entire mask into a pixel area and a normal area.

Evaluation

In terms of the amount of dimensional variations in identical locations in each pixel, the mask produced in the example is improved as compared with a mask produced for comparison.

Further, the positional accuracy (or the amount of displacement) the mask produced in the example with respect to the X direction is reduced by substantially one-half when compared with the mask produced for comparison.

Visible variations were not found in the pixel area of the mask produced in the example, whereas visible variations were found in the pixel area of the mask produced for comparison.

Since all pixels are written under the same condition, data pertaining to a cyclic pattern can be used repeatedly, thereby reducing the volume of data (to about one-tenth of the volume of data required for normal writing operation). According to the example, in relation to a photomask involving an enormous amount of data pertaining to a cyclic pattern, the volume of data can be significantly reduced from that required for normal writing. In the example, one data set (i.e., cyclic data set) was taken as one pixel. However, cyclic data may be formed such that a plurality of pixels are included in one data set.

Moreover, a cyclic pattern section is not limited to one. Even in a case where two or more cyclic pattern sections are formed on a single substrate, the cyclic pattern sections can be written in the same manner as described above.

Second Example

In a second example, a pixel pattern area and a normal pattern area were written over the entire mask through a single writing process, through use of the same writing system as that employed in the first example. In this case, a pattern unit was written through use of an individual writing data set even in a pixel pattern area.

First, a photomask blank was prepared by means of sequentially forming a opaque film and a positive photoresist on a transparent substrate.

The writing data were prepared as follows. The laser writing system has a beam size of 0.75 $\mu$m and a beam scanning width of 453 $\mu$m. In a pixel pattern area, one pixel has a size of 88 $\mu$m in the X direction and a size of 307.5 $\mu$m in the Y direction.

In connection with the X direction, an X width of original data was set to 87.75, which can be evenly divided by 0.75 (a beam size) and is most close to 88 (an original data width). More specifically, original data were converted such that original data were multiplied by (reduced to) 0.997159 (=87.75/88). At this time, data became shorter, by 0.25 $\mu$m per pixel. The thus-converted data were converted back to the original scale at the time of writing operation. More specifically, data were subjected to correction at the time of writing such that an enlarged writing operation was performed at 2489 ppm [(0.25/87.85)×106].

Figure 6A:
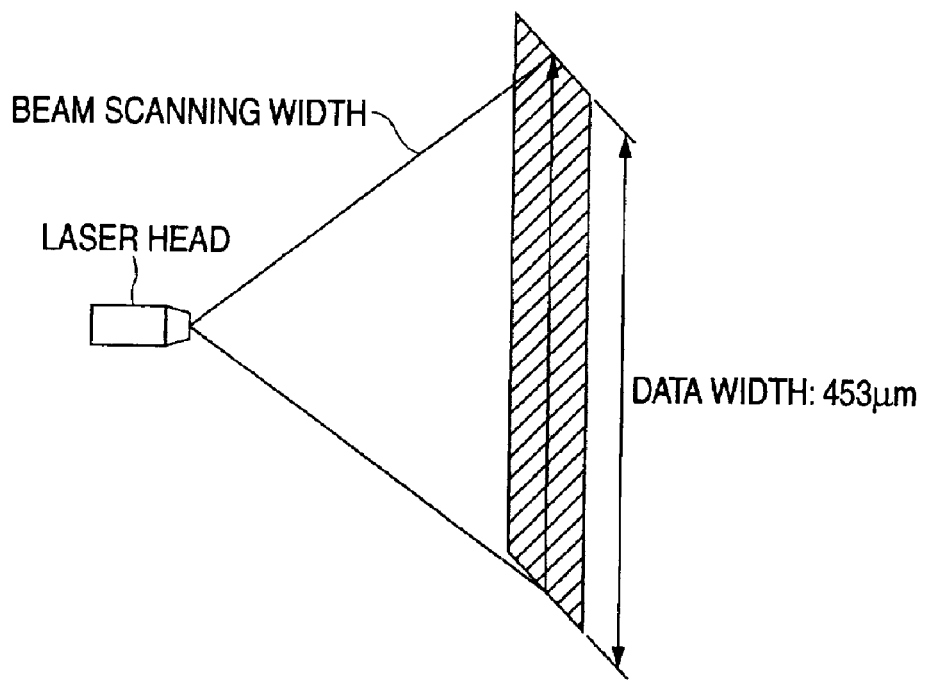
FIGS. 6A and 6B are fragmentary plan views for describing a specific method of writing a pattern in the Y direction according to a second example of the invention.
Figure 6B:
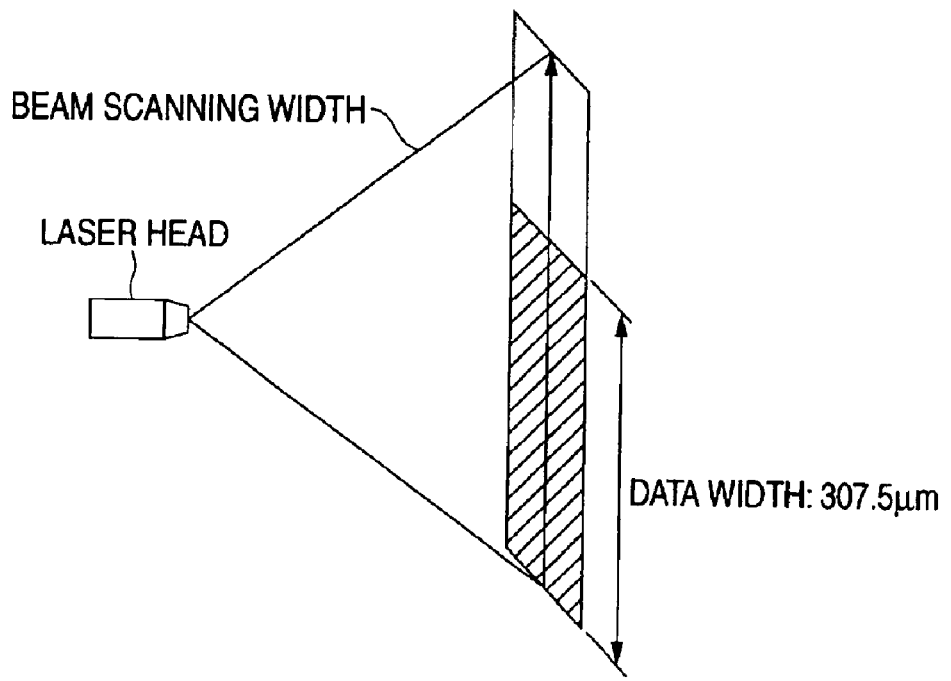

In connection with the Y direction, there was executed a program specifically designed for changing a parameter to used for changing a scanning width, before conversion of original data into writing data such that there is achieved a data width of 307.5 μm (a match exists between a pixel pitch in the Y direction with a width), as shown in FIG. 6B, with respect to a beam scanning width of 453 μm, as shown in FIG. 6A.

As shown in FIG. 7B, at the time of writing operation, a slight overlap is set between scanning widths. When the overlap coincides with a primary pattern of a pixel, an offset from a designed line width attributable to the overlap arises in the same locations on all pixels, which may deteriorate the performance of an element. For this reason, as shown in FIG. 7A, positioning was effected such that the overlap does not fall on a primary pattern.

As mentioned above, after scanning of a beam in the Y direction such that a pixel pitch becomes identical with a writing pitch in the X and Y directions, the mask was fed in the X direction, thus writing a pattern on a resist film of the photomask blank with a resist.

Subsequently, the photoresist was selectively removed with an alkaline developing solution. A opaque film was selectively removed from the areas from which the photoresist had selectively been removed, through etching or the like, thus producing a graytone mask for use in manufacturing a TFT LCD.

Evaluation

Figure 8A:
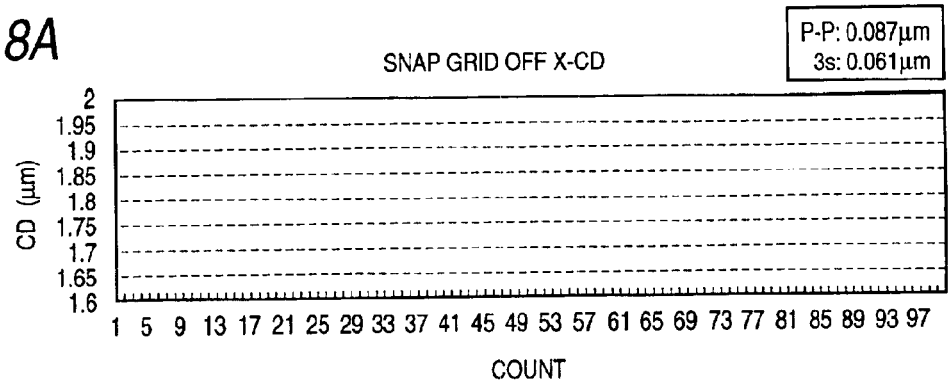
FIGS. 8A and 8B are illustrations showing variation in the width of lines of a opaque film pattern in identical areas of respective pixels when a pattern unit is not matched with conditions for overrun, and an illustration showing variation in the width of lines of a opaque film pattern in identical areas of respective pixels when a pattern unit is matched with the overrun conditions.
Figure 8B:
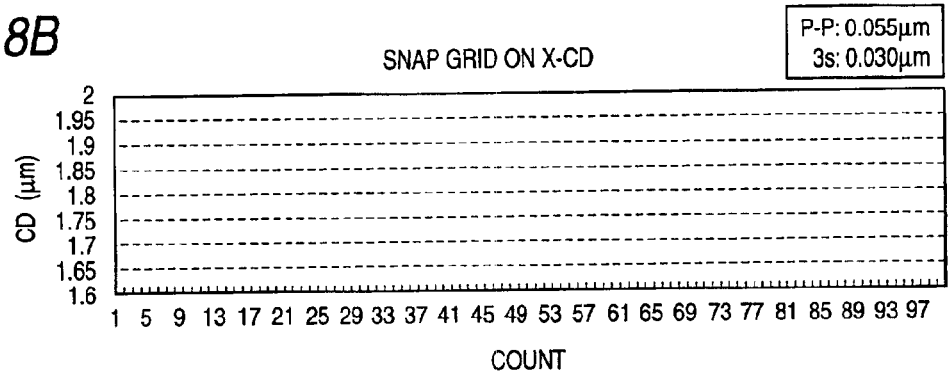

FIG. 8A is an illustration showing variation in the width of lines of a opaque film pattern in identical areas of respective pixels when a pattern unit is not matched with conditions for overrun, and FIG. 8B is an illustration showing variation in the width of lines of a opaque film pattern in identical areas of respective pixels when a pattern unit is matched with the overrun conditions. As is evident form the drawings, when the pattern unit is matched with the overrun conditions [in the case shown in FIG. 8B], variations in line width can be diminished.

Figure 9A:
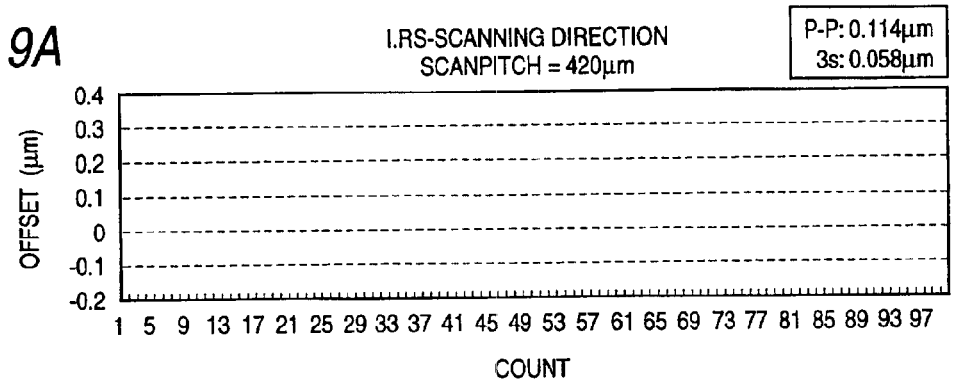
FIGS. 9A and 9B are illustrations showing variation in the width of lines of a opaque film pattern in identical areas of respective pixels when a pattern unit is not matched with a requirement for scanning, and an illustration showing variation in the width of lines of a opaque film pattern in identical areas of respective pixels when a pattern unit is matched with the requirement for scanning.
Figure 9B:
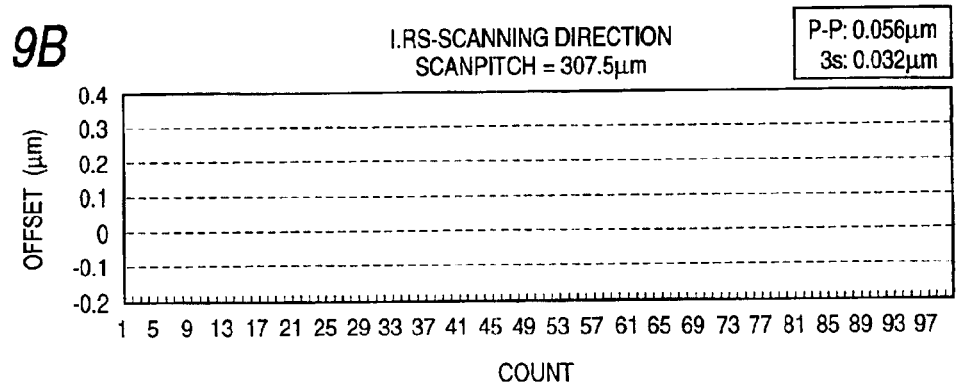

FIG. 9A is an illustration showing variation in the width of lines of a opaque film pattern in identical areas of respective pixels when a pattern unit is not matched with a requirement for scanning, and FIG. 9B is an illustration showing variation in the width of lines of a opaque film pattern in identical areas of respective pixels when a pattern unit is matched with the requirement for scanning. As is evident form the drawings, when the pattern unit is matched with the overrun conditions [in the case shown in FIG. 9B], variations in line width can be diminished.

By means of such a method, a writing operation was performed such that all pixels achieve identical conditions with respect to the X and Y directions, thereby producing a graytone mask for use in manufacturing a TFT LCD. As a result, dimensional variations in identical locations of respective pixels were reduced remarkably.

Visible variations were not found in the pixel area of the mask produced in the example. In contrast, visible variations were found in the pixel area on the mask produced while no match exists between the pattern unit and the scanning requirements.

According to the method of the example, the volume of data becomes slightly greater than that required for an ordinary writing operation. However, as compared with the first example, the second example obviates a necessity for performing a writing operation twice. Therefore, a writing time becomes shorter than that required in the first example. Thus, the example is suitable for writing a pattern of small data volume with high precision.

In the first example, the entire mask was subjected to writing by one operation. However, the mask may be subjected to writing while the mask is divided into a plurality of pattern areas.

Figure 10A:
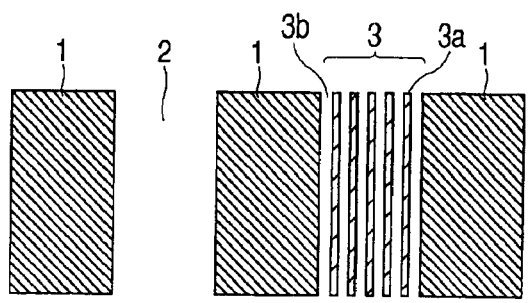
Figure 10B:
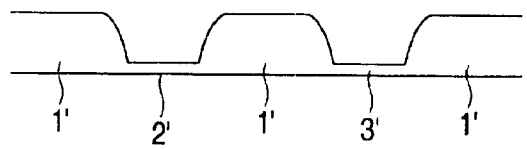
Figure 11:
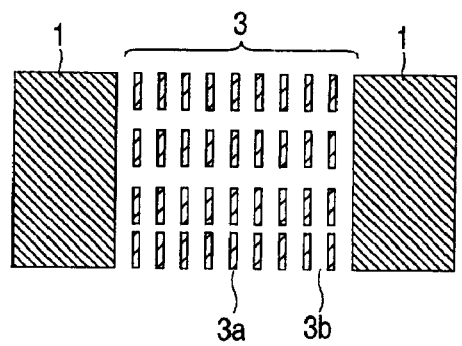
FIG. 11 is a fragmentary plan view for describing another example of a graytone section.

For example, the writing method of the invention can also be applied to writing of a cyclic pattern in a graytone section of a graytone mask, as well as to writing of pixels. In this case, the geometry of a fine pattern constituting a graytone section is not limited to a geometry of lines and spaces, such as that shown in FIG. 10A. The writing method of the invention can also be applied to writing of a cyclic pattern of dotted line type such as that shown in FIG. 11 or a cyclic pattern of dot type or lattice type. Since the graytone section is constituted of a fine cyclic pattern, application of the invention to writing of the graytone section is particularly effective.

Figure 12:
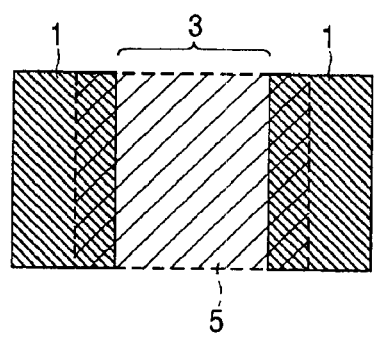
FIG. 12 is a fragmentary plan view for describing still another example of a graytone section.
Figure 13:
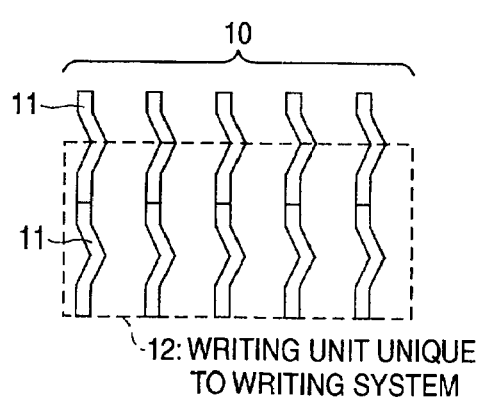
FIG. 13 is a fragmentary plan view for describing a writing unit unique to a writing system.
Figure 14:
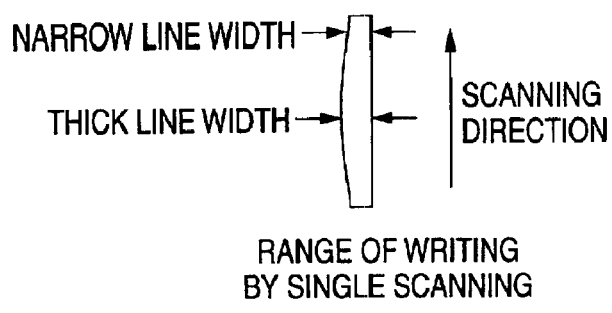
FIG. 14 is a schematic representation for describing a writing range unique to the writing system which performs writing operation through a single scanning action.
Figure 15:
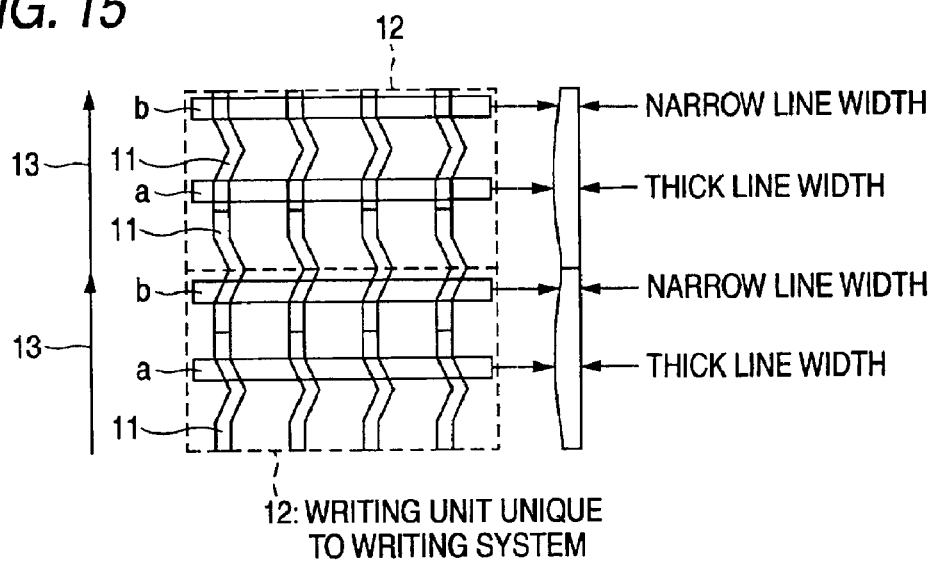
FIG. 15 is a fragmentary plan view for describing a problem which would arise when a writing operation is performed at a writing unit unique to the writing system.
Figure 16:
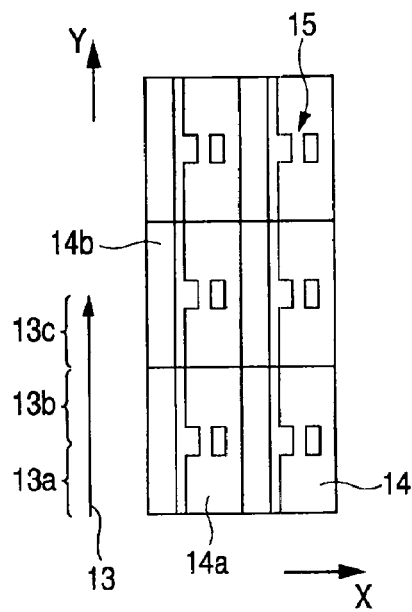
FIG. 16 is a fragmentary plan view for describing a case where a writing operation is performed with a beam scanning width unique to the writing system.
Figure 17:
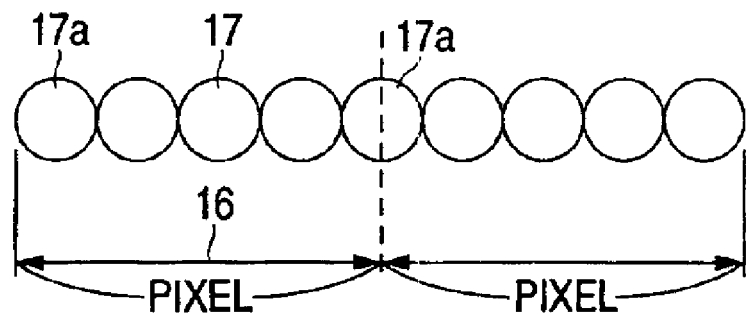
FIG. 17 is a fragmentary plan view for describing a misalignment between grids.
Figure 18:
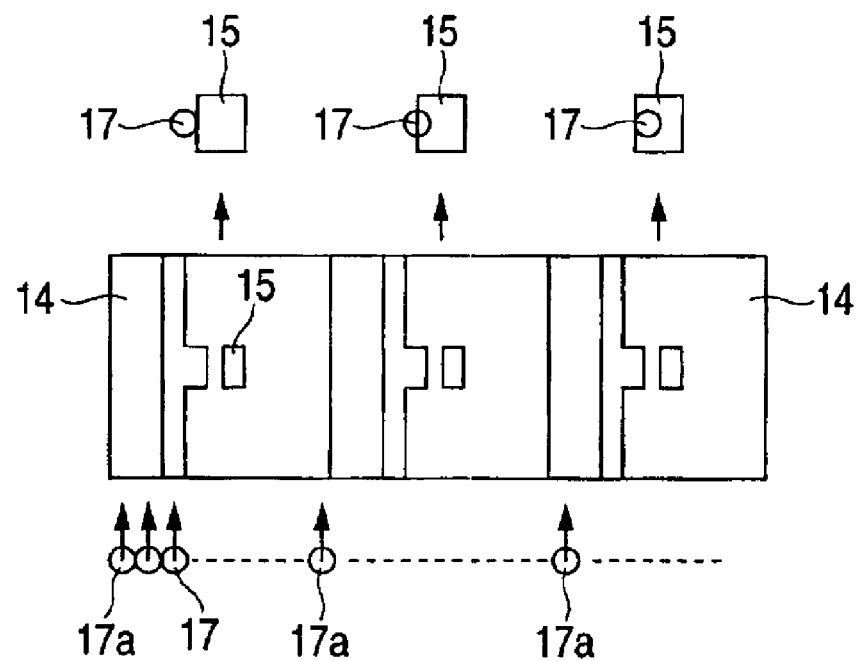
FIG. 18 is a fragmentary plan view for describing a problem which would arise as a result of misalignment between grids.

Even when the graytone section 3 is constituted of a semi-transparent film 5 such as that shown in FIG. 12, the writing method of the invention can be applied to writing of a cyclic pattern such as pixels or a peripheral pattern.

The examples have described a writing mode of so-called raster scan type, wherein a beam is activated for only a pattern section while an overall writing area is being scanned. The invention can also be applied to a writing mode of so-called vector scanning type, wherein a beam scans only areas where patterns are present. More specifically, the writing mode of vector scanning type is for scanning only areas within a scan region—where patterns are formed—through use of a beam in units comprising a plurality of scan regions (i.e., lithography units). After scanning of one pattern has been completed, the beam is deactivated. The beam is then moved to the next pattern in the same scan region, and the beam is activated again to scan that pattern. After writing of all graphics in one scan region has been completed, the beam is moved to the next scan region through movement of X and Y tables. In the case of such a writing mode of vector scanning type, the X and Y lengths of the scan region are caused to coincide with the X and Y lengths of a pattern unit including an identical cyclic pattern, whereby the pattern units can be written under the same writing conditions.

As has been described above, the invention provides a graytone mask which has a high degree of geometrical uniformity in a cyclic pattern area and involves few variations. Particularly, there is provided an LCD graytone mask which has a high degree of geometrical and dimensional evenness in each pixel and involves smaller variations. Further, the volume of writing data can be reduced.

Particularly, a writing and manufacturing method according to the invention is indispensable for putting an LCD graytone mask into practice.

What is claimed is:

1. A manufacturing method for a photomask including a step of performing a writing operation at a predetermined scanning unit in a direction in which a head of a writing system is to be scanned (Y direction) and at predetermined overrun units in a direction perpendicular to the scanning direction (X direction), wherein a pattern of the photomask includes a cyclic pattern; and
the writing step includes a step of writing pattern units including a uniform cyclic pattern under identical overrun conditions.

2. The manufacturing method for a photomask according to claim 1, the beginning of a overrun unit is set to a start point of writing a pattern unit, so that the pattern units are written under the same overrun conditions.

3. The manufacturing method for a photomask according to claim 1, wherein the writing step includes a step of writing the pattern units under the same scanning conditions.

4. A manufacturing method for a photomask including a step of performing a writing operation at a predetermined scanning unit in a direction in which a head of a writing system is to be scanned (Y direction) and at a predetermined overrun unit in a direction perpendicular to the scanning direction (X direction), wherein a photomask of the pattern includes a cyclic pattern section formed from acyclic pattern and a normal pattern section formed from another pattern; and, in the writing step, the cyclic pattern section and the normal pattern section are written in different writing steps, and the cyclic pattern is written such that pattern units including identical cyclic patterns are produced under identical overrun conditions and/or identical scanning conditions.

5. A manufacturing method for a photomask including a writing step of performing a writing operation on a writing unit of a writing apparatus having a predetermined X length and a predetermined Y length, wherein a pattern of the photomask includes a cyclic pattern, the writing step includes a step of writing pattern units including identical cyclic patterns under the same writing conditions by means of matching X and Y lengths of each pattern unit with X and Y lengths of a writing unit;

a writing mode is a raster scanning type in which a beam is scanned over an entire writing area; and a Y length of the writing unit is a scanning unit for the head of the writing system, and an X length of the writing unit is a unit at which the photomask is to be fed in a direction perpendicular to the direction Y.

6. The manufacturing method for a photomask according to claim 1, wherein the photomask is for producing a liquid-crystal display device; and the pattern unit includes an integral number of pixel patterns to be used for preparing pixels of the liquid-crystal device.

7. The manufacturing method for a photomask according to claim 4, wherein the photomask is for producing a liquid-crystal display device; and the pattern unit includes an integral number of pixel patterns to be used for preparing pixels of the liquid-crystal device.

8. The manufacturing method for a photomask according to claim 5, wherein the photomask is for producing a liquid-crystal display device; and the pattern unit includes an integral number of pixel patterns to be used for preparing pixels of the liquid-crystal device.

9. The manufacturing method for a photomask according to claim 1, wherein the photomask is a graytone mask including a opaque section having a opaque film formed thereon, a transmission section, and a graytone section in which is arranged a opaque film pattern having a pattern size smaller than a resolution limit of an exposure system using a mask and which permits partial transmission of exposing radiation; and the graytone section includes a cyclic pattern.

10. The manufacturing method for a photomask according to claim 4, wherein the photomask is a graytone mask including a opaque section having a opaque film formed thereon, a transmission section, and a graytone section in which is arranged a opaque film pattern having a pattern size smaller than a resolution limit of an exposure system using a mask and which permits partial transmission of exposing radiation; and the graytone section includes a cyclic pattern.

11. The manufacturing method for a photomask according to claim 5, wherein the photomask is a graytone mask including a opaque section having a opaque film formed thereon, a transmission section, and a graytone section in which is arranged a opaque film pattern having a pattern size smaller than a resolution limit of an exposure system using a mask and which permits partial transmission of exposing radiation; and the graytone section includes a cyclic pattern.

12. A photomask manufactured through use of the manufacturing method defined in claim 1.

13. A pattern transfer method for transferring a pattern through use of the photomask defined in claim 12.

14. A photomask manufactured through use of the manufacturing method defined in claim 4.

15. A pattern transfer method for transferring a pattern through use of the photomask defined in claim 14.

16. A photomask manufactured through use of the manufacturing method defined in claim 5.

17. A pattern transfer method for transferring a pattern through use of the photomask defined in claim 16.

* * * * *